United States Patent
Wheeland et al.

(10) Patent No.: US 9,368,975 B2
(45) Date of Patent: Jun. 14, 2016

(54) HIGH POWER RF FIELD EFFECT TRANSISTOR SWITCHING USING DC BIASES

(71) Applicant: QUALCOMM Incorporated, San Diego, CA (US)

(72) Inventors: Cody B. Wheeland, San Diego, CA (US); Linda S. Irish, San Diego, CA (US); William H. Von Novak, III, San Diego, CA (US); Gabriel Isaac Mayo, North Potomac, MD (US)

(73) Assignee: QUALCOMM Incorporated, San Diego, CA (US)

( * ) Notice: Subject to any disclaimer, the term of this patent is extended or adjusted under 35 U.S.C. 154(b) by 616 days.

(21) Appl. No.: 13/835,285

(22) Filed: Mar. 15, 2013

(65) Prior Publication Data

US 2014/0152115 A1 Jun. 5, 2014

Related U.S. Application Data

(60) Provisional application No. 61/732,232, filed on Nov. 30, 2012.

(51) Int. Cl.

| | |
|---|---|
| *H01F 27/42* | (2006.01) |
| *H01F 37/00* | (2006.01) |
| *H01F 38/00* | (2006.01) |
| *H02J 5/00* | (2016.01) |
| *H02J 7/02* | (2016.01) |
| *H03J 3/20* | (2006.01) |

(52) U.S. Cl.
CPC .............. *H02J 5/005* (2013.01); *H02J 7/025* (2013.01); *H03J 3/20* (2013.01)

(58) Field of Classification Search
CPC .............. H02J 5/005; H02J 7/025; H03J 3/20
USPC ......................................................... 307/104
See application file for complete search history.

(56) References Cited

U.S. PATENT DOCUMENTS

| | | | |
|---|---|---|---|
| 3,229,218 A | 1/1966 | Sickles et al. | |
| 3,943,286 A * | 3/1976 | Tsurushima | .......... H01L 29/435 257/364 |
| 4,608,583 A | 8/1986 | Curtice | |
| 6,005,355 A | 12/1999 | Siao | |

(Continued)

FOREIGN PATENT DOCUMENTS

DE         3916173 A1    11/1990

OTHER PUBLICATIONS

Skyworks, "GaAs IC Control FET Series, DC-2.5 GHZ," AF002C1-39, AF002C4-39, Jun. 8, 2006, pp. 1-5.
International Search Report and Written Opinion—PCT/US2013/070784—ISA/EPO—Oct. 29, 2014.
Taiwan Search Report—TW102143580—TIPO—Jan. 30, 2015.

*Primary Examiner* — Jared Fureman
*Assistant Examiner* — Esayas Yeshaw
(74) *Attorney, Agent, or Firm* — Knobbe, Martens, Olson & Bear, LLP

(57) ABSTRACT

Systems, methods, and apparatus are provided for tuning in wireless power transfer circuits. One aspect of the disclosure provides an apparatus for tuning. The apparatus includes a field effect transistor having a gate, source, and drain, where the field effect transistor is configured to electrically engage a tuning element to an AC power path. In some embodiments, one of the source or drain contacts is at an alternating current voltage.

36 Claims, 8 Drawing Sheets

(56) References Cited

U.S. PATENT DOCUMENTS

| | | | |
|---|---|---|---|
| 6,882,829 B2 | 4/2005 | Mostov et al. | |
| 7,839,216 B2 | 11/2010 | Alidio et al. | |
| 9,093,215 B2* | 7/2015 | Low | H01F 38/14 |
| 2006/0270367 A1* | 11/2006 | Burgener | H01Q 23/00 |
| | | | 455/127.1 |
| 2007/0018699 A1 | 1/2007 | Abbasi | |
| 2007/0109708 A1 | 5/2007 | Hussman et al. | |
| 2007/0228833 A1* | 10/2007 | Stevens | H02J 5/005 |
| | | | 307/45 |
| 2007/0232241 A1* | 10/2007 | Carley | H04B 1/48 |
| | | | 455/83 |
| 2008/0088415 A1 | 4/2008 | Quan | |
| 2008/0186115 A1* | 8/2008 | Okanobu | H03J 1/0008 |
| | | | 334/55 |
| 2009/0096413 A1* | 4/2009 | Partovi | H01F 5/003 |
| | | | 320/108 |
| 2009/0146892 A1* | 6/2009 | Shimizu | G06K 19/0726 |
| | | | 343/745 |
| 2009/0160500 A1* | 6/2009 | Niculae | H02M 1/08 |
| | | | 327/109 |
| 2011/0090723 A1 | 4/2011 | Hu et al. | |
| 2011/0278945 A1* | 11/2011 | Wheatley, III | H04B 5/0037 |
| | | | 307/104 |
| 2012/0299557 A1 | 11/2012 | Kwon et al. | |
| 2013/0342031 A1* | 12/2013 | Xu | H03K 5/153 |
| | | | 307/650 |
| 2014/0175895 A1* | 6/2014 | Ishi | H02J 17/00 |
| | | | 307/104 |
| 2014/0176067 A1* | 6/2014 | Suzuki | H01M 10/46 |
| | | | 320/108 |

\* cited by examiner

HIGH POWER RF FIELD EFFECT TRANSISTOR SWITCHING USING DC BIASES

The present application claims priority to provisional U.S. Application Ser. No. 61/732,232, entitled "HIGH POWER RF FIELD EFFECT TRANSISTOR SWITCHING USING DC BIASES," filed Nov. 30, 2012, assigned to the assignee hereof and incorporated herein by reference in its entirety.

FIELD

The present invention relates generally to wireless power. More specifically, the disclosure is directed to using a switch for tuning in a wireless power transfer system.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power, thereby often requiring recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an apparatus for tuning. In one embodiment, the apparatus includes a tuning element and a field effect transistor. The field effect transistor includes a gate, a first terminal contact, and a second terminal contact. In some embodiments, the field effect transistor can electrically engage the tuning element to AC (alternating current) power based on a change of an electrical characteristic of the gate with respect to an electrical characteristic of the first terminal contact. In some embodiments, the first terminal contact is at an alternating current voltage. The apparatus further includes a drain bias circuitry to reduce internal drain source capacitance of a Field Effect Transistor. The apparatus can further include DC blocking capacitors. In one embodiment, the apparatus can also include a gate biasing circuitry configured to adjust the electrical characteristic of the gate with respect to the electrical characteristic of the first terminal contact to drive the field effect transistor. The electrical characteristic can include a bias potential. The tuning element can include a capacitor or an inductor or a combination of both.

Figure 1:
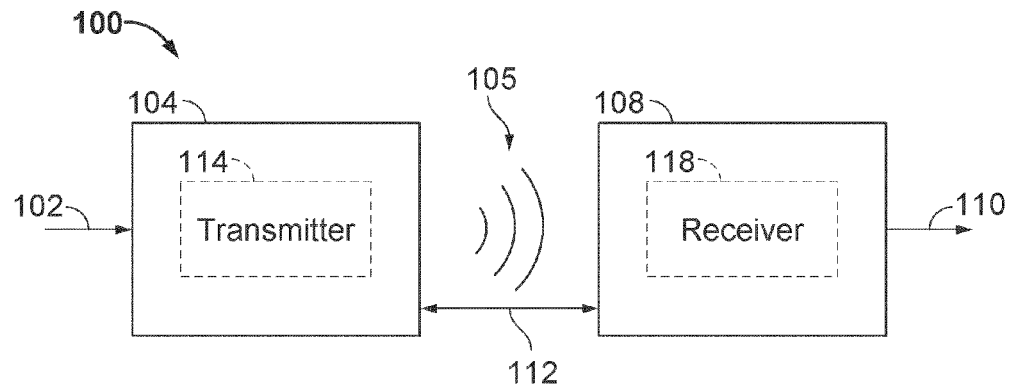
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" to achieve power transfer.

FIG. 1 is a functional block diagram of an exemplary wireless power transfer system 100, in accordance with exemplary embodiments of the invention. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 105. In some cases, the field 105 may correspond to the "near-field" of the transmitter 104 as will be further described below. The transmitter 104 may include a transmit antenna 114 for outputting an energy transmission. The receiver 108 further includes a receive antenna 118 for receiving or capturing energy from the energy transmission. The near-field may correspond to a region in which there are strong reactive fields resulting from the currents and charges in the transmit antenna 114 that minimally radiate power away from the transmit antenna 114. In some cases the near-field may correspond to a region that is within about one wavelength (or a fraction thereof) of the transmit antenna 114. The transmit and receive antennas 114 and 118 are sized according to applications and devices to be associated therewith. As described above, efficient energy transfer may occur by coupling a large portion of the energy in a field 105 of the transmit antenna 114 to a receive antenna 118 rather than propagating most of the energy in an electromagnetic wave to the far field. When positioned within the field 105, a "coupling mode" may be developed between the transmit antenna 114 and the receive antenna 118. The area around the transmit and receive antennas 114 and 118 where this coupling may occur is referred to herein as a coupling-mode region.

Figure 2:
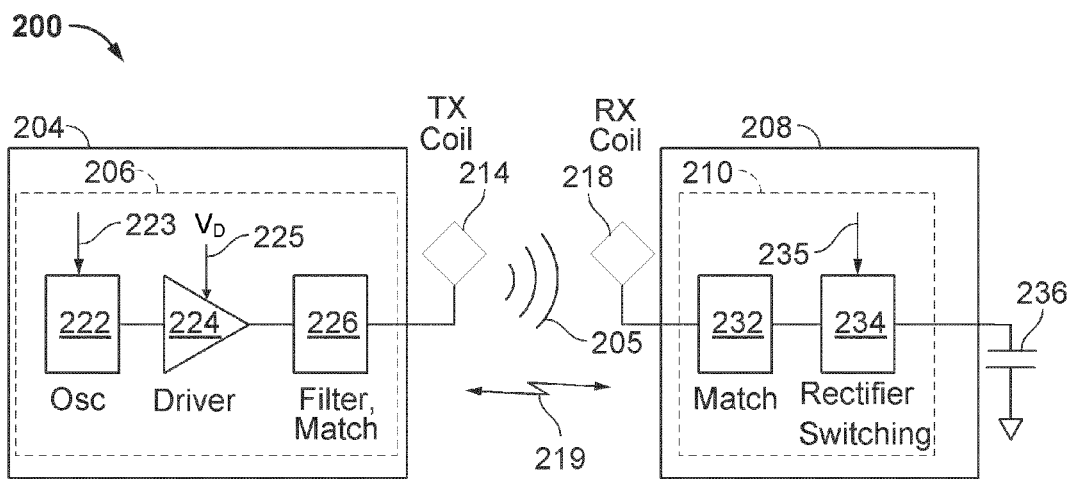
FIG. 2 is a functional block diagram of exemplary components that may be used in the wireless power transfer system of FIG. 1, in accordance with various exemplary embodiments of the invention.

FIG. 2 is a functional block diagram of exemplary components that may be used in the wireless power transfer system 100 of FIG. 1, in accordance with various exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 468.75 KHz, 6.78 MHz or 13.56 MHz, that may be adjusted in response to a frequency control signal 223. The oscillator signal may be provided to a driver circuit 224 configured to drive the transmit antenna 214 at, for example, a resonant frequency of the transmit antenna 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit antenna 214. As a result of driving the transmit antenna 214, the transmitter 204 may wirelessly output power at a level sufficient for charging or power an electronic device. As one example, the power provided may be for example on the order of 300 milliWatts to 5 Watts to power or charge different devices with different power requirements. Higher or lower power levels may also be provided.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive antenna 218. The receiver 208 and transmitter 204 may additionally communicate on a separate communication channel 219 (e.g., Bluetooth, zigbee, cellular, etc). The receiver 208 and transmitter 204 may alternatively communicate via in-band signaling using characteristics of the wireless field 206.

As described more fully below, receiver 208, that may initially have a selectively disablable associated load (e.g., battery 236), may be configured to determine whether an amount of power transmitted by transmitter 204 and received by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
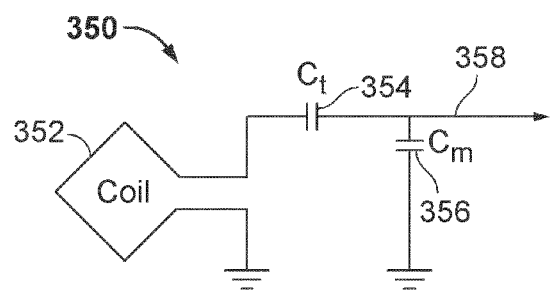
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of transmit circuitry 206 or receive circuitry 210 of FIG. 2 including a transmit or receive antenna 352, in accordance with exemplary embodiments of the invention. As illustrated in FIG. 3, transmit or receive circuitry 350 used in exemplary embodiments including those described below may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, an antenna 352 is an example of a "power transfer component" of a type that is configured to wirelessly output and/or receive power. The antenna 352 may be configured to include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled-mode region of the transmit antenna 214 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmit antenna 214 coil to the receive antenna 218 residing in the neighborhood where this field 105 is established rather than propagating the energy from the transmit antenna 214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, capacitor 352 and capacitor 354 may be added to the transmit or receive circuitry 350 to create a resonant circuit that selects a signal 356 at a resonant frequency. Accordingly, for larger diameter antennas, the size of capacitance needed to sustain resonance may decrease as the diameter or inductance of the loop increases. Furthermore, as the diameter of the antenna increases, the efficient energy transfer area of the near-field may increase. Other resonant circuits formed using other components are also possible. As another non-limiting example, a capacitor may be placed in parallel between the two terminals of the antenna 350. For transmit antennas, a signal 358 with a frequency that substantially corresponds to the resonant frequency of the antenna 352 may be an input to the antenna 352.

In one embodiment, the transmitter 104 may be configured to output a time varying magnetic field with a frequency corresponding to the resonant frequency of the transmit antenna 114. When the receiver is within the field 105, the time varying magnetic field may induce a current in the receive antenna 118. As described above, if the receive antenna 118 is configured to be resonant at the frequency of the transmit antenna 118, energy may be efficiently transferred. The AC signal induced in the receive antenna 118 may be rectified as described above to produce a DC signal that may be provided to charge or to power a load.

Figure 4:
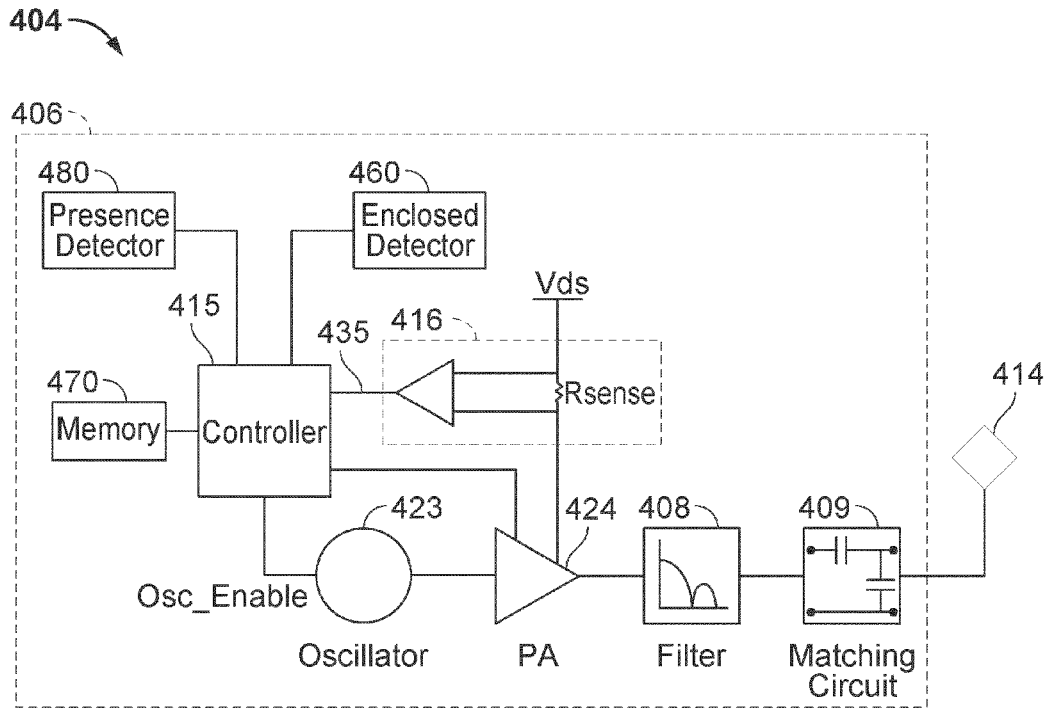
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit antenna 414. The transmit antenna 414 may be the antenna 352 as shown in FIG. 3. Transmit circuitry 406 may provide RF power to the transmit antenna 414 by providing an oscillating signal resulting in generation of energy (e.g., magnetic flux) about the transmit antenna 414. Transmitter 404 may operate at any suitable frequency. By way of example, transmitter 404 may operate at the 6.78 MHz ISM band.

Transmit circuitry 406 may include a fixed impedance matching circuit 409 for matching the impedance of the transmit circuitry 406 (e.g., 50 ohms) to the transmit antenna 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the antenna 414 or DC current drawn by the driver circuit 424. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit antenna 414 may be on the order of 2.5 Watts.

Transmit circuitry 406 may further include a controller 415 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 415 may also be referred to herein as processor 415. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit antenna 414. By way of example, a load sensing circuit 416 monitors the current flowing to the driver circuit 424, that may be affected by the presence or absence of active receivers in the vicinity of the field generated by transmit antenna 414 as will be further described below. Detection of changes to the loading on the driver circuit 424 are monitored by controller 415 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit antenna 414 may be implemented with a Litz wire or as an antenna strip with the thickness, width and metal type selected to keep resistive losses low. In a one implementation, the transmit antenna 414 may generally be configured for association with a larger structure such as a table, mat, lamp or other less portable configuration. Accordingly, the transmit antenna 414 generally may not need "turns" in order to be of a practical dimension. An exemplary implementation of a transmit antenna 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmit circuitry 406 may include a presence detector 480, an enclosed detector 460, or a combination thereof, connected to the controller 415 (also referred to as a processor herein). The controller 415 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit antenna 414 may transmit at a specific frequency. In some cases, these regulations are meant to protect humans from electromagnetic radiation. However, there may be environments where a transmit antenna 414 is placed in areas not occupied by humans, or occupied infrequently by humans, such as, for example, garages, factory floors, shops, and the like. If these environments are free from humans, it may be permissible to increase the power output of the transmit antenna 414 above the normal power restrictions regulations. In other words, the controller 415 may adjust the power output of the transmit antenna 414 to a regulatory level or lower in response to human presence and adjust the power output of the transmit antenna 414 to a level above the regulatory level when a human is outside a regulatory distance from the electromagnetic field of the transmit antenna 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive antenna 218 that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
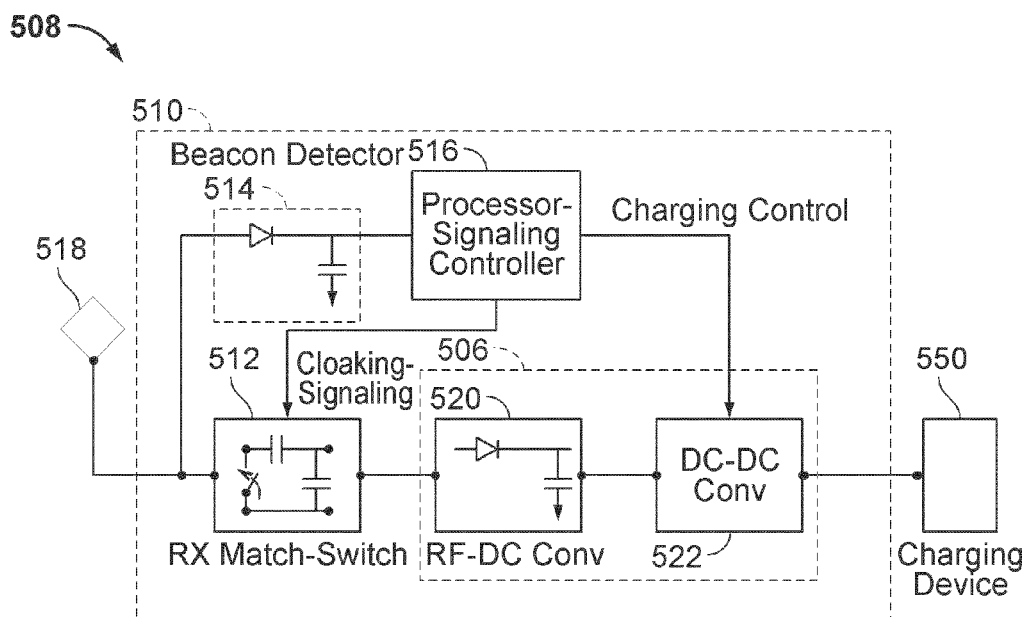
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive antenna 518. Receiver 508 further couples to device 550 for providing received power thereto. It should be noted that receiver 508 is illustrated as being external to device 550 but may be integrated into device 550. Energy may be propagated wirelessly to receive antenna 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (an other medical devices), and the like.

Receive antenna 518 may be tuned to resonate at the same frequency, or within a specified range of frequencies, as transmit antenna 414 (FIG. 4). Receive antenna 518 may be similarly dimensioned with transmit antenna 414 or may be differently sized based upon the dimensions of the associated device 550. By way of example, device 550 may be a portable electronic device having diametric or length dimension smaller that the diameter of length of transmit antenna 414. In such an example, receive antenna 518 may be implemented as a multi-turn coil in order to reduce the capacitance value of a tuning capacitor (not shown) and increase the receive coil's impedance. By way of example, receive antenna 518 may be placed around the substantial circumference of device 550 in order to maximize the antenna diameter and reduce the number of loop turns (i.e., windings) of the receive antenna 518 and the inter-winding capacitance.

Receive circuitry 510 may provide an impedance match to the receive antenna 518. Receive circuitry 510 includes power conversion circuitry 506 for converting a received RF energy source into charging power for use by the device 550. Power conversion circuitry 506 includes an RF-to-DC converter 520 and may also in include a DC-to-DC converter 522. RF-to-DC converter 520 rectifies the RF energy signal received at receive antenna 518 into a non-alternating power with an output voltage represented by $V_{rect}$. The DC-to-DC converter 522 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive antenna 518 to the power conversion circuitry 506 or alternatively for disconnecting the power conversion circuitry 506. Disconnecting receive antenna 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter driver circuit 424. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive antenna 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations, that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 522 for improved performance.

Figure 6:
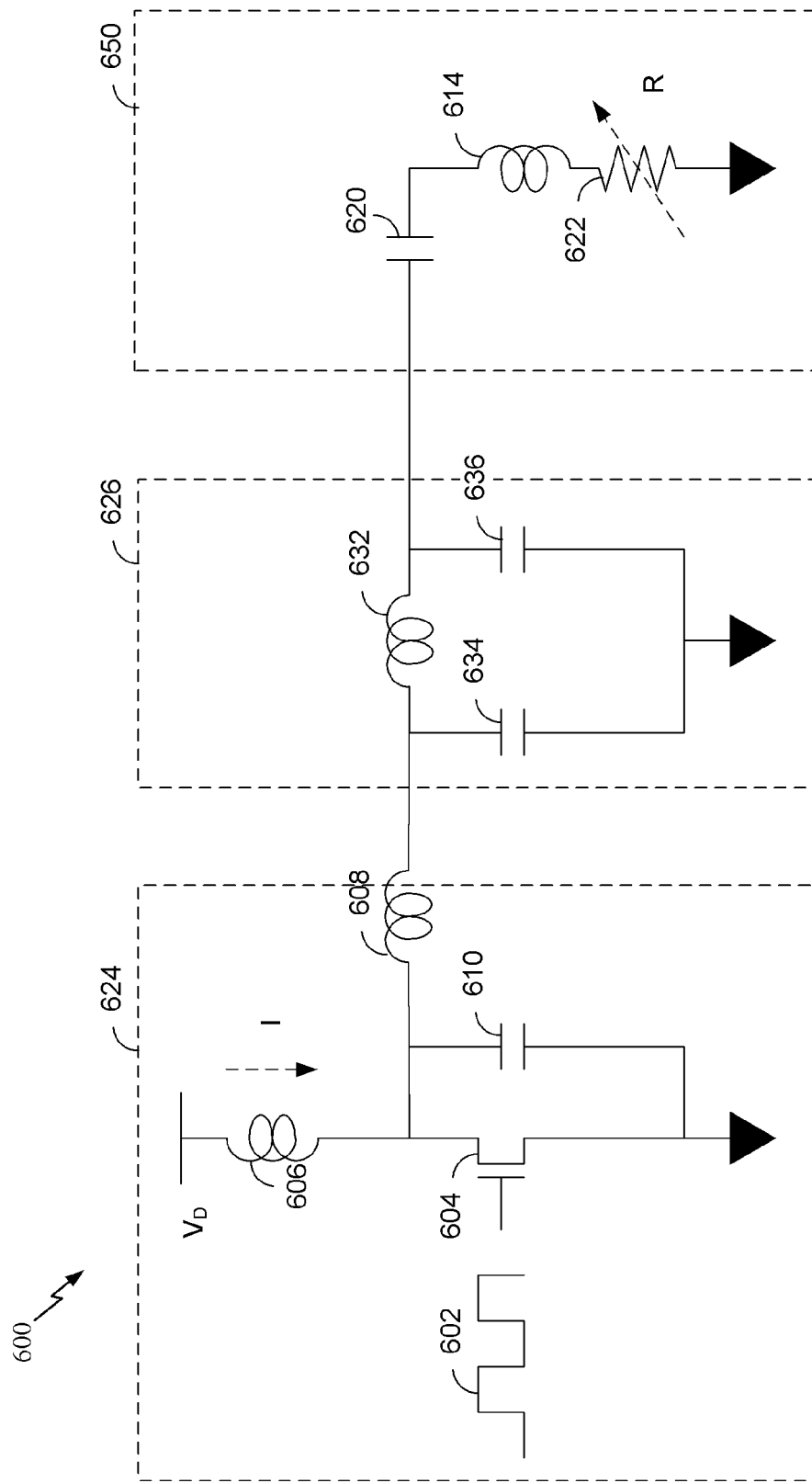
FIG. 6 is a schematic diagram of a portion of transmit circuitry that may be used in the transmit circuitry of FIG. 4.

FIG. 6 is a schematic diagram of a portion of transmit circuitry 600 that may be used in the transmit circuitry 406 of FIG. 4. The transmit circuitry 600 may include a driver circuit 624 as described above in FIG. 4. As described above, the driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier, however, any suitable driver circuit 624 may be used in accordance with embodiments of the invention. The driver circuit 624 may be driven by an input signal 602 from an oscillator 423 as shown in FIG. 4. The driver circuit 624 may also be provided with a drive voltage $V_D$ that is configured to control the maximum power that may be delivered through a transmit circuit 650. To eliminate or reduce harmonics, the transmit circuitry 600 may include a filter circuit 626. The filter circuit 626 may be a three pole (capacitor 634, inductor 632, and capacitor 636) low pass filter circuit 626.

The signal output by the filter circuit 626 may be provided to a transmit circuit 650 comprising an antenna 614. The transmit circuit 650 may include a series resonant circuit having a capacitance 620 and inductance (e.g., that may be due to the inductance or capacitance of the antenna or to an additional capacitor component) that may resonate at a frequency of the filtered signal provided by the driver circuit 624. The load of the transmit circuit 650 may be represented by the variable resistor 622. The load may be a function of a wireless power receiver 508 that is positioned to receive power from the transmit circuit 650.

Figure 7:
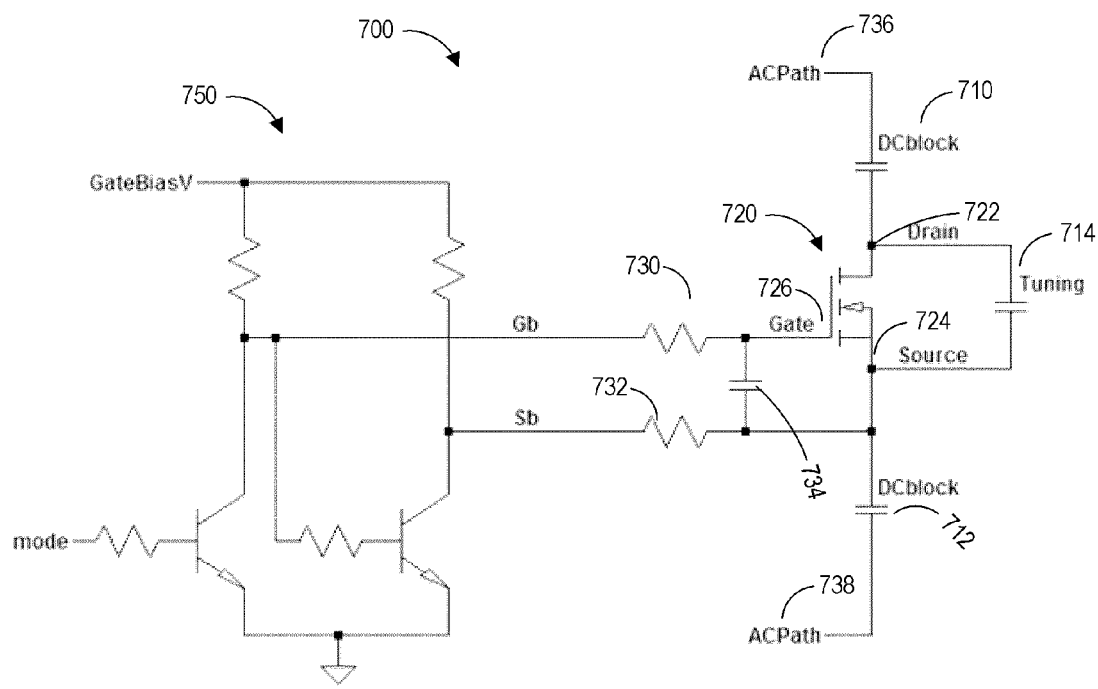
FIG. 7 is a schematic diagram of an exemplary tuning circuit that may be used in a wireless power transfer system of FIG. 1, in accordance with exemplary embodiments of the invention.

FIG. 7 is a schematic diagram of an exemplary tuning circuit for optimizing power transfer in a wireless power transmitter, in accordance with the exemplary embodiments of the invention. Embodiments described herein provide tuning in a wireless power transfer system described above. Embodiments described herein for the tuning circuit include a tuning element and a switch having a first connection, a second connection, and a third connection. In another embodiment, the switch may have a fourth connection. The switch can electrically engage the tuning element in to an AC (alternating current) or time varying voltage power path. In one embodiment, the power path that includes a resonator based on an electrical characteristic of the first connection with respect to an electrical characteristic of the second connection. In one respect, the switch shorts a tuning element in and out of the AC power path. Many types of switches may be used, for example, field effect transistors, a relay, a pin diode, or a diode bridge. Tuning elements may include capacitors or inductors or any other elements that can vary the reactance of the circuit. In some embodiments, a combination of capacitors and inductors are used for tuning.

FIG. 7 shows a field effect transistor 720 (FET) with a source contact 724, a drain contact 722, and a gate contact 726. In one embodiment, the source 724 is connected to the drain 722 in series with the AC power path 736 to 738. While in another embodiment, the FET 720 may be configured in a shunt configuration (not shown). The AC power may have a frequency of 6.78 MHz. A tuning element 714 (for example, a capacitor) can be placed in parallel with the FET 720 as shown in FIG. 7.

The FET 720 can electrically engage the tuning element 714 from the AC power path based on a mode of operation. In one mode of operation, the FET 720 shorts out a path 722 to 724. In this mode, the current flows between points 722 and 724 through the FET 720 and the tuning element 714 is electrically isolated because the FET 720 provides a less resistive path. The mode of operation depends on the potential at the gate contact 726 with respect to the source contact 724 as shown in FIG. 7. In a second mode, the AC power path passes through the tuning element 714. The mode of operation can depend on the need for changing the tuning (or reactance) of the circuit.

Field Effect Transistors can provide a low cost option for switching. Driving a FET, however, in a wireless power transfer system presents some unique challenges. The FET 720 shown in FIG. 7 is connected in series with the AC power path. In a shunt configuration, the FET is placed in parallel with the AC power path. The FET 720 can be a n-MOSFET or p-MOSFET. Other types of FETS may also be used. For example, a GaAs FET can be used as a switch. Placing the FET 720 in series with the AC power path can present challenges in driving the FET. For instance, the voltage at the source 724 can vary significantly. In one embodiment, the voltage at the source can be oscillating with hundreds of volts of 6.78 MhZ AC for a wireless power system. In a wireless power system, high voltage AC on the FET source 724 or drain 722 contacts can make driving the floating FET as shown in FIG. 7 challenging.

FIG. 7 shows an exemplary embodiment of driving a floating FET. High impedance DC biases can be used to drive the FET. Applying high impedance DC biases to floating nodes can drive the contacts to the desired voltages without using excess current. The bias circuitry 750 can control the relative DC bias and enable switching of the FET 720. The bias circuitry 750 may comprise resistors and transistors to enable setting a potential difference between the source contact 724 and the gate contact 726. The gate contact 726 is coupled to the source contact 724 through a capacitor 734. In one embodiment, capacitor 734 is a high value capacitor. Adding a high value capacitor 734 between the source and the drain causes the gate AC waveform to follow that of the source, but with a DC offset as provided by the bias circuitry. In one embodiment, the potential between the gate contact 726 and the source contact 724 is ±10 V. In another embodiment, this potential is around ±13 V. The FET 720 is switched depending on the potential between the gate contact 726 and the source contact 724.

In one embodiment, DC blocking capacitors 710 and 712 are placed in a series with the source contact 712 and the drain contact 710 as shown in FIG. 7. The capacitors 710 and 712 can isolate the source and drain contacts, allowing them to float relative to the ground.

The resistance value of resistors 730 and 732 can be varied to find an optimal balance between high switching speed of the FET 720 and transformation due to shunt components on the path. In one embodiment, the resistors 730 and 732 may have a resistance value of 1 megaohm. Other values of resistance, for example, 5 or 10 Megaohms may also be used. Higher resistance value in resistors 730 and 732 may result in reduced switching speed, but higher resistance can increase efficiency of the circuit because of reduced transformation.

The FET 720 also has internal capacitances between each of the source 724, drain 722, and gate 726 contacts. There is an internal gate to source capacitance, an internal gate to drain capacitance, and an internal drain to source capacitance. In one embodiment, the capacitance value of the gate to source capacitor 734 is higher than the internal source-drain capacitance. In one embodiment, the source capacitor 734 has a value of 1 nF.

Figure 8:
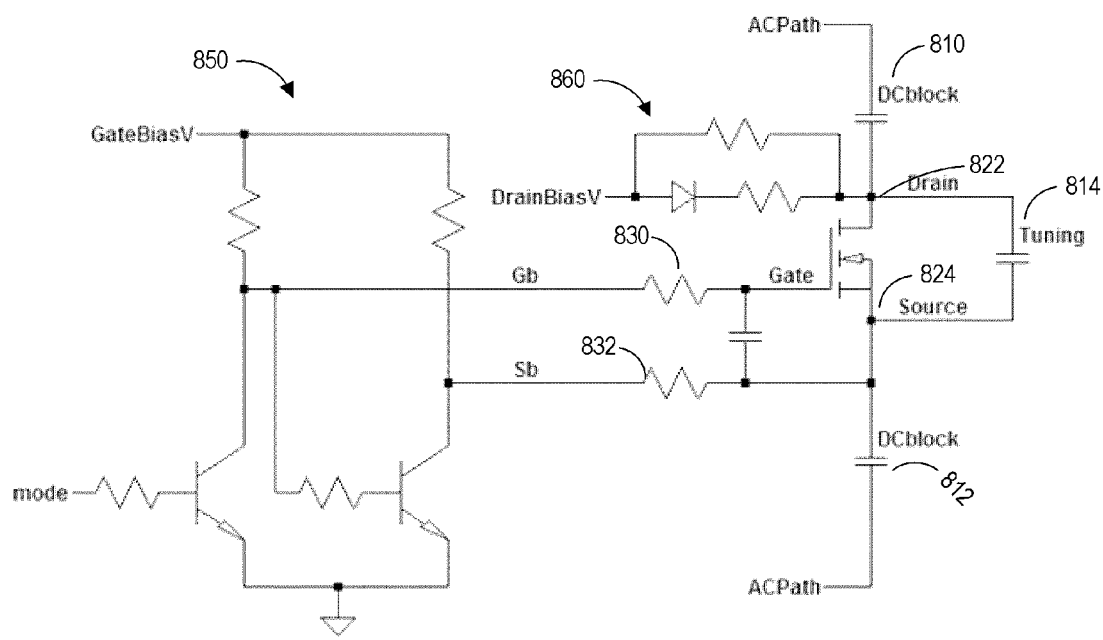
FIG. 8 is a schematic diagram of an exemplary tuning circuit that may be used in a wireless power transfer system of FIG. 1, in accordance with exemplary embodiments of the invention.

FIG. 8 shows an exemplary embodiment of the tuning circuit of FIG. 7 with an additional drain bias circuit 860 configured to reduce the internal capacitance of the FET. As described above, FETs have an internal drain source capacitance, which can be effectively in parallel with the tuning element 814. The Q factor of internal drain source capacitance is low and the capacitance value varies with the drain source voltage. When the drain source voltage is very low, the drain source capacitance is high and when the drain source voltage increases the capacitance goes down. The internal capacitance may also result in electro-magnetic interference. A low internal drain source capacitance can enable more predictable control over the tuning circuit. In at least one mode of operation when the tuning capacitor has to be switched out of the AC power path, the FET 820 is shorted between the drain contact 822 and the source contact 824. The internal capacitance may, however, prevent effective shorting and result in poor tuning of the circuit. The drain bias circuitry 860 can raise the voltage at the drain contact to increase the voltage difference between the drain and source for reducing the internal drain source capacitance. While the drain bias circuitry is described with respect to the type of transistor illustrated in FIG. 8, similarly the source can also be biased depending on if the transistor used is or n or p type. The bias circuitry 860 enables biasing of the drain contact 822. The bias circuitry 860 is high impedance to the AC power path. The bias circuitry is not limited to the components as shown in FIG. 8. In one embodiment, the resistor in series with the diode in bias circuitry 860 has a value of 10 Megaohm and the resistor in series with the diode has a value of 10 Megaohm. In some instances, the resistor parallel to the diode can be higher than series. Other configurations of bias circuitry 860 may also be used to bias the drain contact 822. A more expensive FET, for example a GaAS FET, may also be used with low internal capacitances. Biasing the drain source contact 822 allows using inexpensive FETs in a wireless power transfer system. For example, the bias circuitry enables using FETs in a wireless power transfer system without having to worry about the output capacitance of the FET. In some embodiments, even FETs which have output capacitance approaching that of the desired tuning capacitance (or reactance) in a wireless power transfer system may be used. Accordingly, the drain bias circuitry 860 described here with respect to FIG. 8 and the drain bias circuitry 960 described below with respect to FIG. 9 enables the use of various types of FETs without worrying about their output capacitance. This can significantly reduce the cost and increase the flexibility of the overall system.

Figure 9:
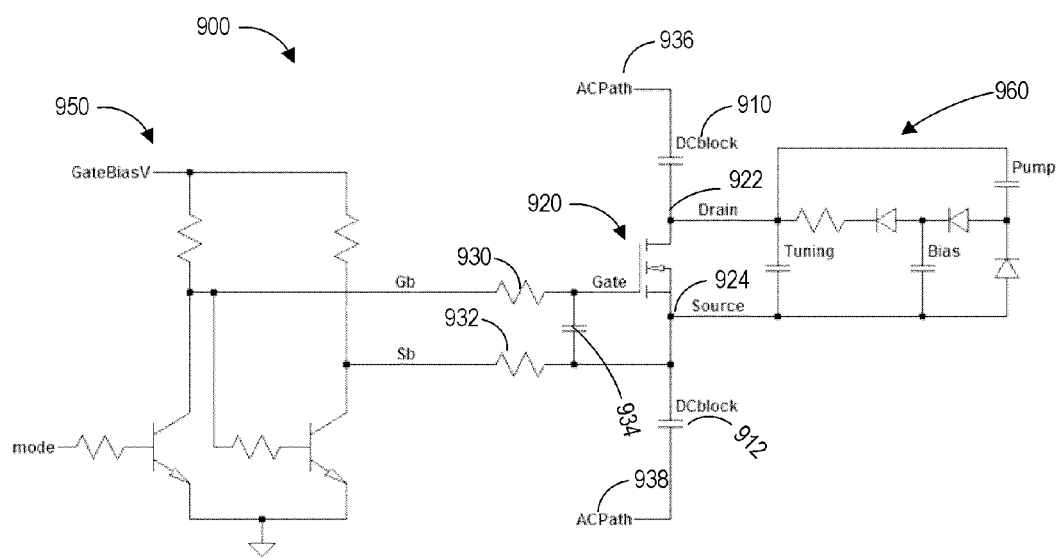
FIG. 9 is a schematic diagram of an exemplary tuning circuit that may be used in a wireless power transfer system of FIG. 1, in accordance with exemplary embodiments of the invention.

FIG. 9 shows another exemplary embodiment for reducing the internal capacitance of a FET 926. The bias circuitry 960 can bias the drain contact 922 with respect to the source contact 924. The bias circuitry 960 can use the avalanche characteristics of the FET 920. As shown in FIG. 9, the bias circuitry 960 uses the input AC signal to self-bias the drain contact. The bias circuitry 960 can rectify the AC signal and increase the input voltage by a multiplier factor. In the exemplary embodiment shown in FIG. 9, the bias circuitry 960 is configured as a voltage doubler that doubles the input voltage for biasing the drain contact 922. In one embodiment, the bias circuitry 960 provides a bias of greater than half of Vds peak-peak. This might be achieved by a voltage multiplier as shown in FIG. 9. In some instances, the bias might raise the voltage to a point (Vbreakdown-½Vpeak-peak) where the FET might start breaking down and limiting the bias. In such instances, the system might still be operational as long as the current is limited. The current can be limited by a resistor. The resistor can limit the current below the maximum breakdown current of the FET. In one embodiment, in the drain bias circuitry 960, the value of the pump and bias capacitor is 100 pF and the value of the resistor is 330 kiloohms. The bias circuitry 960 can also include other configurations that result in a different multiplying factor than the exemplary embodiment shown in FIG. 9. As described above, the arrangement of the drain circuitry depends on whether a n or p type field effect transistor is used. Thus, in some embodiments, the drain bias circuitry may be arranged to bias the source.

Figure 10:
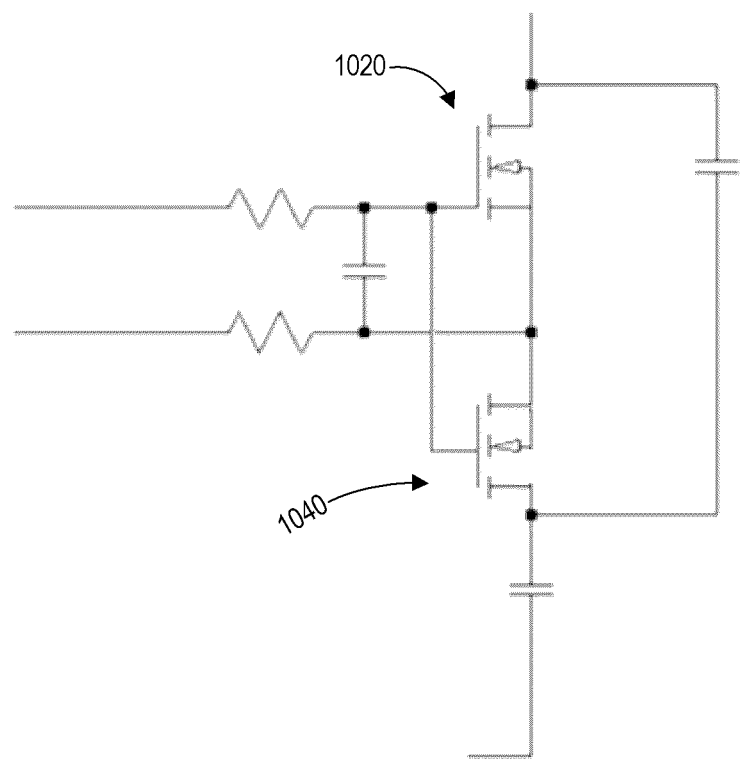
FIG. 10 is a schematic diagram of an exemplary tuning circuit that may be used in a wireless power transfer system of FIG. 1, in accordance with exemplary embodiments of the invention.

FIG. 10 shows an exemplary embodiment of the tuning circuit comprising a first FET 1020 and a second FET 1040. Adding a second FET 1040 may improve voltage rating and decrease distortion in the circuit and may also allow passage of a DC current. The drain bias circuitries 860 and 960 described above can also be combined with the circuitry shown in FIG. 10.

Figure 11:
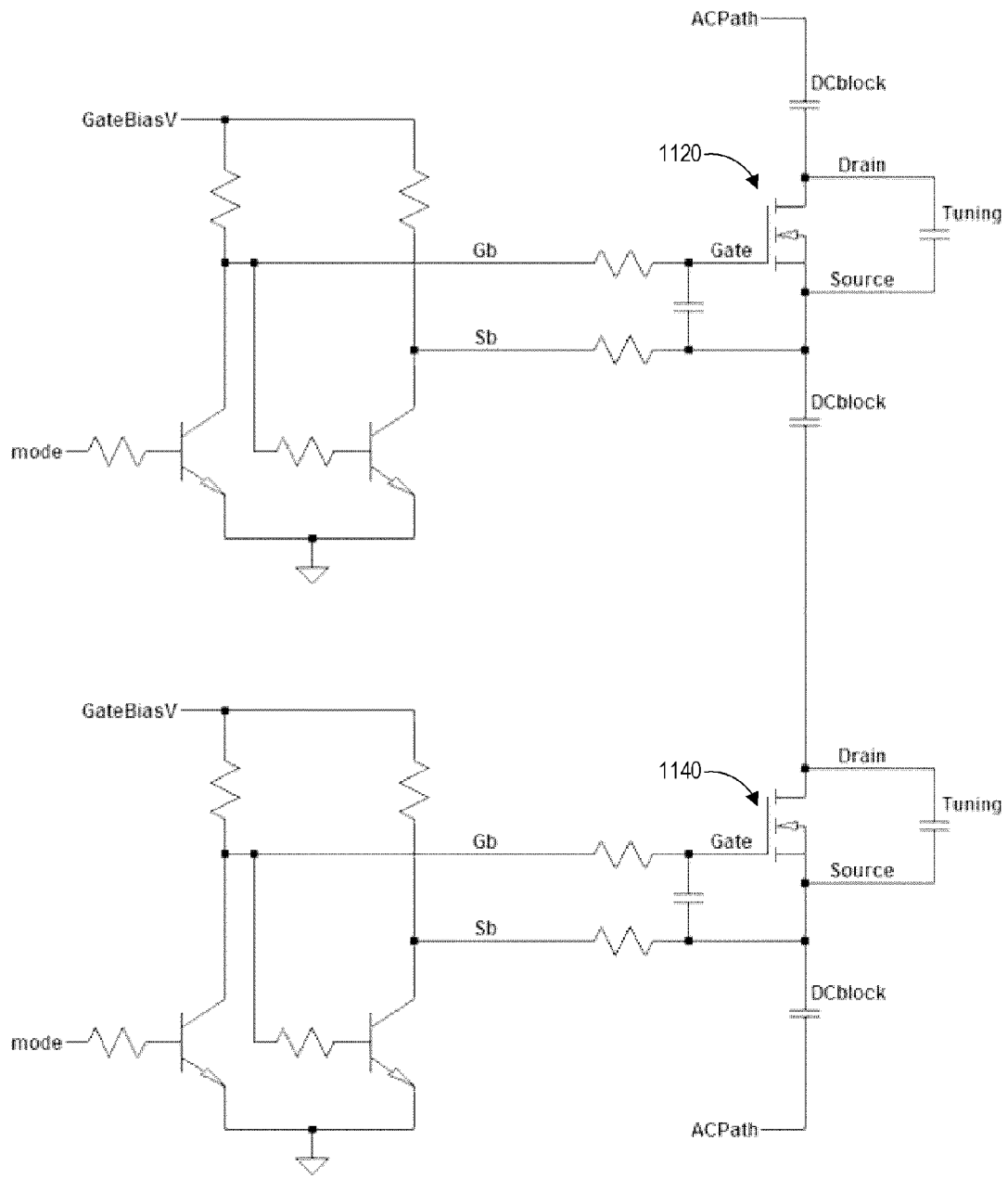
FIG. 11 is a schematic diagram of an exemplary tuning circuit that may be used in a wireless power transfer system of FIG. 1, in accordance with exemplary embodiments of the invention.

FIG. 11 shows an exemplary embodiment of multiple tuning circuits 1120 and 1140 placed in series with the AC power path. While only two tuning circuits are shown, more may be connected in series. Multiple tuning circuits may enable higher degree of control for tuning the wireless power transfer system described above. The tuning elements may also be configured in a shunt configuration. In a shunt configuration, the tuning element is connected in series with the FET.

Figure 12:
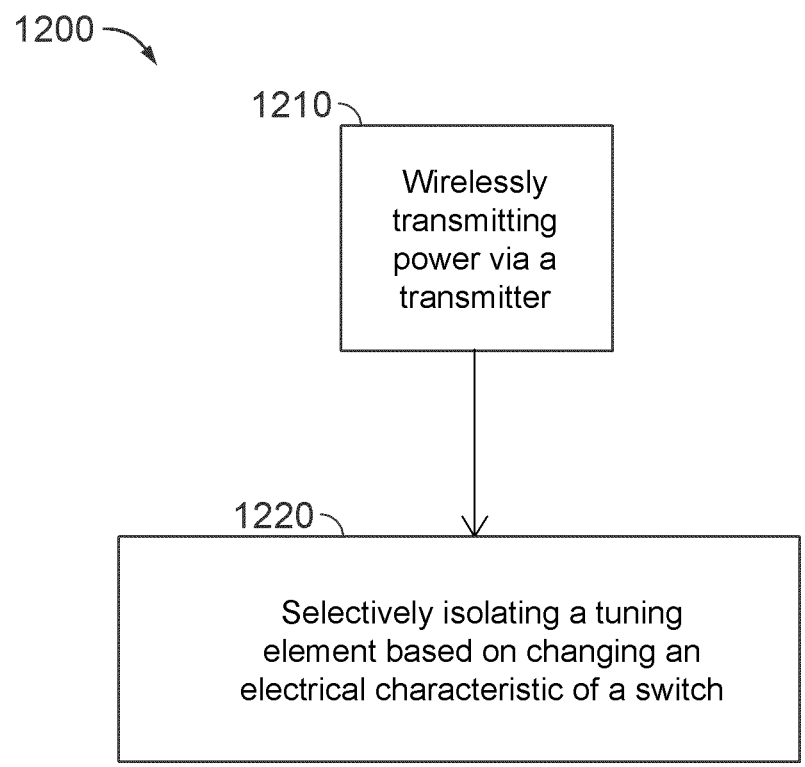
FIG. 12 is a flowchart diagram of a method of tuning in a wireless power transfer system, in accordance with exemplary embodiments of the invention.

FIG. 12 is a flowchart diagram of a method for tuning in a wireless power transfer system, in accordance with exemplary embodiments of the invention. The wireless power transfer system 100 as shown in FIG. 1 comprises a transmitter and a receiver. Input power may be provided to a transmitter from a power source for generating field for providing energy transfer. In the method, at step 1210, a transmitter in a wireless power transfer system is transmitting power. A receiver may couple to the field and generate output power. The transmitter and receiver are separated by a distance. As described above, efficient transfer of energy between the transmitter and receiver may occur during matched or nearly matched resonance between the transmitter and the receiver.

Resonance may depend on impedance matching. The impedance may be adaptively varied as described with respect to transmit circuitry 406 in FIG. 4. The impedance may be varied based on tuning elements described with respect to the tuning circuit in FIG. 7. The method at step 1220, further comprises the step of selectively engaging a tuning element based on changing an electrical characteristic of a switch. The electrical characteristic of the switch may be the bias potential as described with respect to field effect transistor 720 of FIG. 7.

Figure 13:
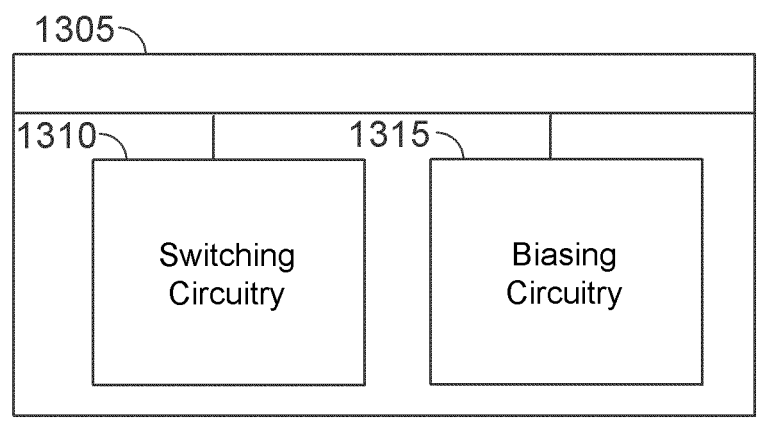
FIG. 13 is a functional block diagram of a tuning circuit that may be used in a wireless power transfer system of FIG. 1, in accordance with exemplary embodiment of the invention.

FIG. 13 is a functional block diagram of a wireless power 1305, in accordance with an exemplary embodiment of the invention. Wireless power tuning circuit 1305 comprises means 1310 and 1315 for the various actions discussed with respect to FIGS. 7, 8, 9, 10 and 11.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for providing tuning in a wireless power transfer system, comprising:
 a tuning element;
 a field effect transistor having a gate, a first terminal contact, and a second terminal contact, said first terminal contact is at an alternating current (AC) voltage, the field effect transistor configured to electrically engage the tuning element to an AC power path based on a change in an electrical characteristic of the gate with respect to an electrical characteristic of the first terminal contact; and
 a first capacitor coupled to the first terminal contact and a second capacitor coupled to the second terminal contact.

2. The apparatus of claim 1, further comprising a gate biasing circuitry configured to change the electrical characteristic of the gate with respect to the electrical characteristic of the first terminal contact to drive the field effect transistor, wherein the electrical characteristic comprises a bias potential.

3. The apparatus of claim 1, further comprising a bias circuitry configured to reduce output capacitance of the field effect transistor by biasing the second terminal contact such that the second terminal contact is at higher bias than the first terminal contact.

4. The apparatus of claim 3, wherein the drain bias circuitry comprises a self-biasing multiplier circuit.

5. The apparatus of claim 1, wherein the tuning element is connected parallel to the field effect transistor.

6. The apparatus of claim 1, wherein the field effect transistor comprises a n-type mosfet such that first terminal is a source terminal and the second terminal is a drain terminal of the field effect transistor.

7. The apparatus of claim 1, wherein the field effect transistor comprises a p-type mosfet such that first terminal is a drain terminal and the second terminal is a source terminal of the field effect transistor.

8. The apparatus of claim 1, wherein the tuning element comprises a capacitor or an inductor.

9. The apparatus of claim 1, further comprising a second tuning element, wherein the second tuning element comprises a capacitor or an inductor.

10. The apparatus of claim 1, wherein the first and the second capacitors are DC blocking capacitors and are configured to keep the first and the second terminal contacts floating relative to the AC path.

11. The apparatus of claim 1, wherein an output capacitance of the field effect transistor substantially approaches a desired tuning in the wireless power transfer system.

12. The apparatus of claim 1, wherein the gate is coupled to the first terminal with a capacitor.

13. A method of wireless transmitting power, the method comprising:
  providing a tuning element;
  providing a field effect transistor having a gate, a first terminal contact, a second terminal contact, said first terminal contact being at an alternating current (AC) voltage, and a first capacitor coupled to the first terminal contact and a second capacitor coupled to the second terminal contact; and
  electrically engaging the tuning element to an AC power path based on changing an electrical characteristic of the gate with respect to an electrical characteristic of the first terminal contact of the field effect transistor.

14. The method of claim 13, further comprising the step of changing the electrical characteristic of the gate with respect to the electrical characteristic of the first terminal contact using a gate biasing circuitry for driving the field effect transistor, wherein the electrical characteristic comprises a bias potential.

15. The method of claim 13, further comprising the step of biasing the second terminal contact using a drain bias circuitry such that the second terminal contact is at higher bias than the first terminal contact.

16. The method of claim 15, wherein the drain bias circuitry comprises a self-biasing multiplier circuit.

17. The method of claim 13, wherein the tuning element is connected parallel to the field effect transistor.

18. The method of claim 13, wherein the field effect transistor comprises a n-type mosfet such that the first terminal is a drain terminal and the second terminal is a source terminal of the field effect transistor.

19. The method of claim 13, wherein the field effect transistor comprises a p-type mosfet such that the first terminal is a source terminal and the second terminal is a drain terminal of the field effect transistor.

20. The method of claim 13, wherein the tuning element comprises a capacitor or an inductor.

21. The method of claim 13, further comprising the step of providing a second tuning element wherein the second tuning element comprises a capacitor or an inductor.

22. The method of claim 13, further comprising the step of keeping the first terminal contact and the second terminal contact floating relative to the AC path.

23. The method of claim 13, wherein an output capacitance of the field effect transistor substantially approaches a desired tuning in the wireless power transfer system.

24. The method of claim 13, wherein the gate is coupled to the first terminal with a capacitor.

25. A tuning circuit, configured to provide tuning in a wireless power transfer system, the tuning circuit comprising:
  means for tuning;
  means for switching, said means for switching comprising a field effect transistor having a gate, a first terminal contact, and a second terminal contact, said first terminal contact being at an alternating current (AC) voltage;
  means for electrically engaging the tuning element to an AC power path based on changing an electrical characteristic of the gate with respect to an electrical characteristic of the first terminal contact of the field effect transistor;
  first means for providing capacitance to the means for switching at a first terminal contact of the means for switching; and
  second means for providing capacitance to the means for switching at a second terminal contact of the means for switching.

26. The tuning circuit of claim 25, further comprising the means for electrically engaging using a gate biasing circuitry for driving the field effect transistor, wherein the electrical characteristic comprises a bias potential.

27. The tuning circuit of claim 25, further comprising means for biasing the second terminal contact using a drain bias circuitry such that the second terminal contact is at higher bias than the first terminal contact.

28. The tuning circuit of claim 27, wherein the drain bias circuitry comprises a self-biasing multiplier circuit.

29. The tuning circuit of claim 25, wherein the means for tuning is connected parallel to the field effect transistor.

30. The tuning circuit of claim 25, wherein the field effect transistor comprises a n-type mosfet such that the first terminal is a drain terminal and the second terminal is a source terminal of the field effect transistor.

31. The tuning circuit of claim 25, wherein the field effect transistor comprises a p-type mosfet such that the first terminal is a source terminal and the second terminal is a drain terminal of the field effect transistor.

32. The tuning circuit of claim 25, wherein the means for tuning element comprises a capacitor or an inductor.

33. The tuning circuit of claim 25, further comprising means for providing a second means for tuning, wherein the second means for tuning comprises a capacitor or an inductor.

34. The tuning circuit of claim 25, further comprising means for keeping the first terminal and the second terminal floating relative to the AC path.

35. The tuning circuit of claim 25, wherein an output capacitance of the field effect transistor substantially approaches a desired tuning in the wireless power transfer system.

36. The tuning circuit of claim 25, wherein the gate is coupled to the first terminal with a capacitor.

* * * * *